(12) United States Patent
Ye

(10) Patent No.: US 8,223,493 B2
(45) Date of Patent: Jul. 17, 2012

(54) ELECTRONIC DEVICE AND FAN MODULE THEREOF

(75) Inventor: Zhen-Xing Ye, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 268 days.

(21) Appl. No.: 12/649,297

(22) Filed: Dec. 29, 2009

(65) Prior Publication Data

US 2011/0116234 A1 May 19, 2011

(30) Foreign Application Priority Data

Nov. 19, 2009 (CN) .......................... 2009 1 0309986

(51) Int. Cl.
*H05K 7/20* (2006.01)
(52) U.S. Cl. .................... 361/695; 361/679.48
(58) Field of Classification Search ............. 361/679.48, 361/695
See application file for complete search history.

(56) References Cited

U.S. PATENT DOCUMENTS

| | | | | |
|---|---|---|---|---|
| 5,208,730 A * | 5/1993 | Tracy | ........................ | 361/679.48 |
| 5,777,848 A * | 7/1998 | McAnally et al. | ............. | 361/725 |
| 5,835,347 A * | 11/1998 | Chu | ............................... | 361/697 |
| 5,854,738 A * | 12/1998 | Bowler | ........................ | 361/695 |
| 5,973,921 A * | 10/1999 | Lin | ................................ | 361/695 |
| 6,104,609 A * | 8/2000 | Chen | ............................. | 361/695 |
| 6,134,115 A * | 10/2000 | Sim et al. | ....................... | 361/747 |
| 6,269,001 B1 * | 7/2001 | Matteson et al. | ............. | 361/695 |
| 6,317,320 B1 * | 11/2001 | Cosley et al. | ................. | 361/695 |
| 6,327,148 B1 * | 12/2001 | Tucker et al. | ................. | 361/704 |
| 6,672,374 B1 * | 1/2004 | Lin | ................................ | 165/121 |
| 6,894,898 B2 * | 5/2005 | Liu | ................................ | 361/697 |
| 6,950,306 B2 * | 9/2005 | Huang et al. | .................. | 361/697 |
| 7,054,155 B1 * | 5/2006 | Mease et al. | .................. | 361/695 |
| 7,133,288 B2 * | 11/2006 | DelPrete et al. | ............. | 361/719 |
| 7,236,361 B2 * | 6/2007 | Cote et al. | ...................... | 361/695 |
| 7,301,768 B2 * | 11/2007 | Fan et al. | ....................... | 361/695 |
| 7,580,259 B2 * | 8/2009 | Hsiao | ............................ | 361/695 |
| 2003/0188847 A1 * | 10/2003 | Lai et al. | ....................... | 165/80.2 |
| 2006/0291170 A1 * | 12/2006 | Hsiao | ............................ | 361/704 |
| 2009/0154092 A1 * | 6/2009 | Chen | ........................... | 361/679.51 |
| 2009/0257192 A1 * | 10/2009 | Li | ................................. | 361/695 |
| 2011/0122573 A1 * | 5/2011 | Peng et al. | ............... | 361/679.48 |

* cited by examiner

*Primary Examiner* — Anatoly Vortman
(74) *Attorney, Agent, or Firm* — Altis Law Group, Inc.

(57) ABSTRACT

An electronic device includes an enclosure, an expansion card received in the enclosure, and a fan module received in the enclosure for dissipating heat of the expansion card. The fan module includes a cooling fan and a fixing member. The fixing member includes a fixing portion fixed on the cooling fan, a first rotary portion rotatably connected to the fixing portion, and a second rotary portion rotatably connected to the fixing portion. The first rotary portion and the second rotary portion are fixed on the enclosure.

11 Claims, 6 Drawing Sheets

ELECTRONIC DEVICE AND FAN MODULE THEREOF

BACKGROUND

1. Technical Field

The present disclosure relates generally to fan modules, and particularly to a fan module for cooling expansion cards of an electronic device.

2. Description of Related Art

Advances in microelectronics technology have resulted in expansion cards of electronic devices, such as computers, which process signals and data at unprecedented high speeds. During operation of many contemporary expansion cards, a large amount of heat is produced, and a cooling fan is usually mounted in the electronic device to prevent damage. However, the expansion cards can be installed in different orientations, such as vertical or horizontal, but the arrangement of the cooling fan is unchangeable and may not cool as efficiently for all arrangements.

What is needed, therefore, is an electronic device with a fan module which can overcome the above limitations.

DETAILED DESCRIPTION

Figure 1:
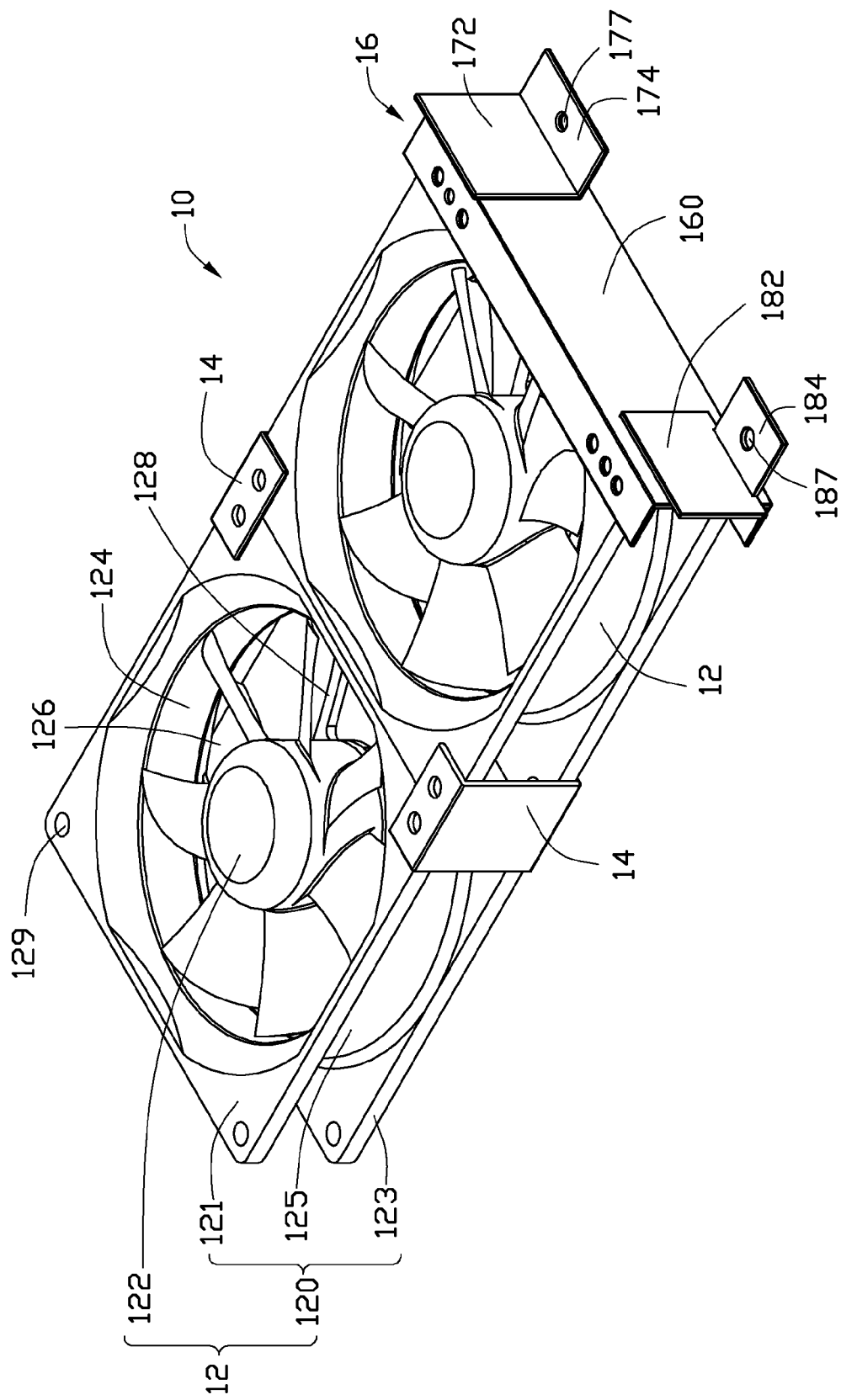
FIG. 1 is an isometric, assembled view of a fan module according to an exemplary embodiment.

Referring to FIG. 1, a fan module 10 according to an exemplary embodiment includes two axial fans 12, a pair of connecting members 14, and a fixing member 16. The axial fans 12 are used to generate airflow. The pair of connecting members 12 are configured for interconnecting the two axial fans 12. It should be understood that the number of axial fans 12 can be changed according to need, and the number of pairs of connecting members 12 should be changed accordingly.

Figure 2:
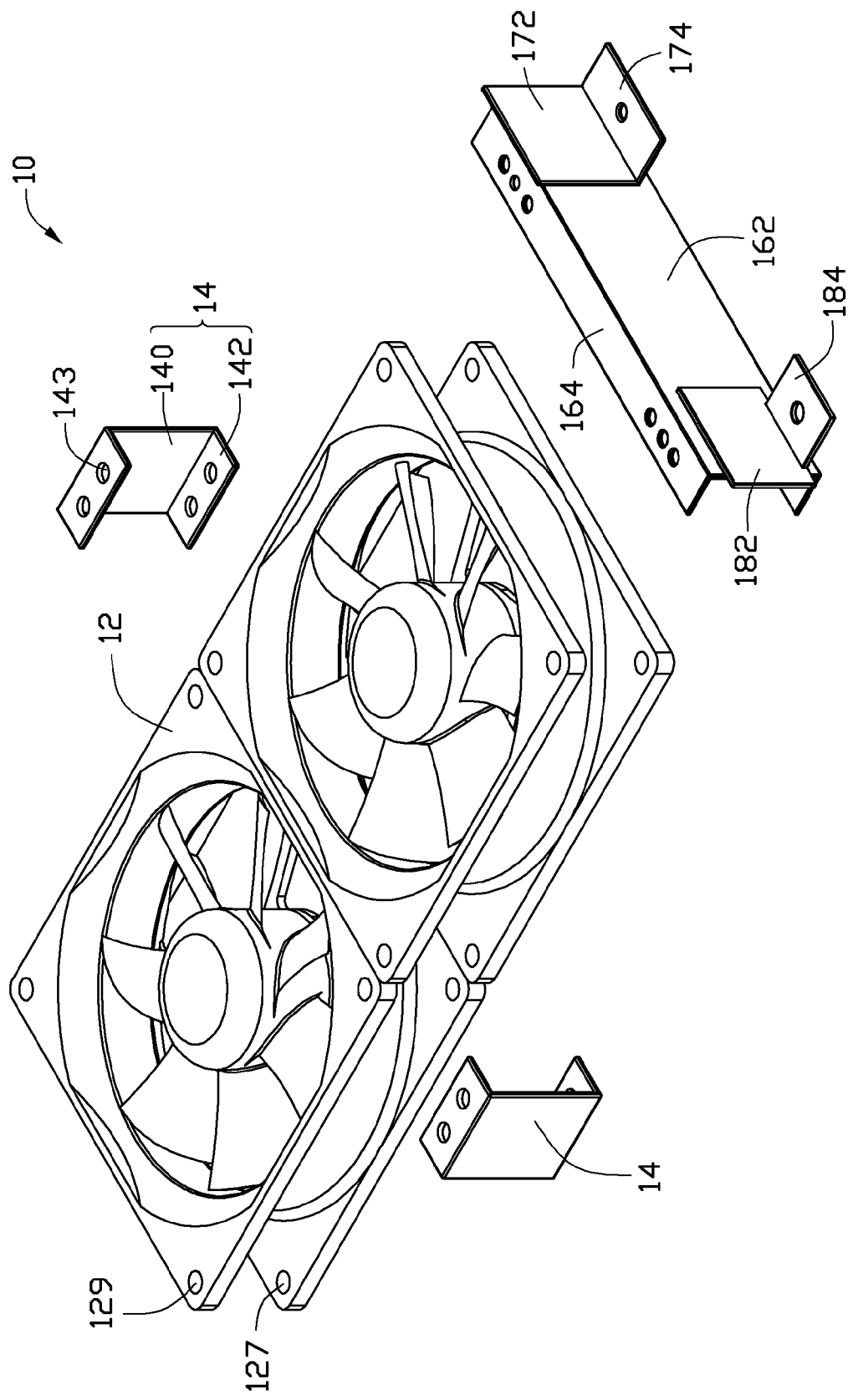
FIG. 2 is an exploded view of the fan module of FIG. 1.

The two axial fans 12 are arranged side by side and are the same as each other. Each axial fan 12 includes a frame 120 and an impeller 122 received in the frame 120. The frame 120 includes a top wall 121, a bottom wall 123, and a sidewall 125 between the top wall 121 and the bottom wall 123. The top wall 121 is rectangular. A mounting 129 is defined in each corner of the top wall 121. An air inlet 124 is defined in a central portion of the top wall 121 for guiding airflow into the axial fan 12. The bottom wall 123 is similar to the top wall 121, and is arranged parallel to the top wall 121. A mounting hole 127 (as shown in FIG. 2) is defined in each corner of the bottom wall 123 corresponding to the mounting hole 129 of the top wall 121. An air outlet 126 is defined in the bottom wall 123 for airflow flowing out the axial fan 12. A supporting base 128 is arranged in the air outlet 126 of the bottom wall 123 for supporting the impeller 122 thereon. The sidewall 125 is annular, and extends from an inner periphery of the top wall 121 to an inner periphery of the bottom wall 123.

Referring to FIG. 2, the pair of connecting members 14 are the same as each other. Each of the connecting members 14 includes a connecting portion 140 and a pair of mounting portions 142 bending from top and bottom edges of the connecting portion 140, respectively. The connecting portion 140 is rectangular. A height of the connecting portion 140 is substantially the same as a height of the frame 120 of the axial fan 12. The mounting portions 142 of each connecting member 14 are parallel to each other, and both are perpendicular to the connecting portion 140. A pair of mounting holes 143 is defined in each of the mounting portions 142 of the connecting members 14.

The pair of connecting members 14 are arranged at opposite sides of the axial fans 12, respectively. Each connecting member 14 is arranged at a position corresponding to a joint of the two axial fans 12. One of the mounting portions 142 of the connecting member 14 abuts against the top walls 121 of the two axial fans 12 with the mounting holes 143 aligned with the mounting holes 129 of the top walls 121, and the other mounting portion 142 of the connecting member 14 abuts against the bottom walls 123 of the two axial fans 12 with the mounting holes 143 aligned with the mounting holes 127 of the bottom walls 123. Thus screws (not shown) can extend through the mounting holes 143 of the connecting members 14 to engage in the mounting holes 129 of the top walls 121 and the mounting holes 127 of the bottom walls 123 of the frame 120. Accordingly, the two axial fans 12 are combined together by the connecting members 14.

The fixing member 16 is fixed on one of the two axial fans 12 at a side away from the other axial fan 12. The fixing member 16 includes a fixing portion 160, a first rotary portion 170, and a second rotary portion 180.

Figure 3:
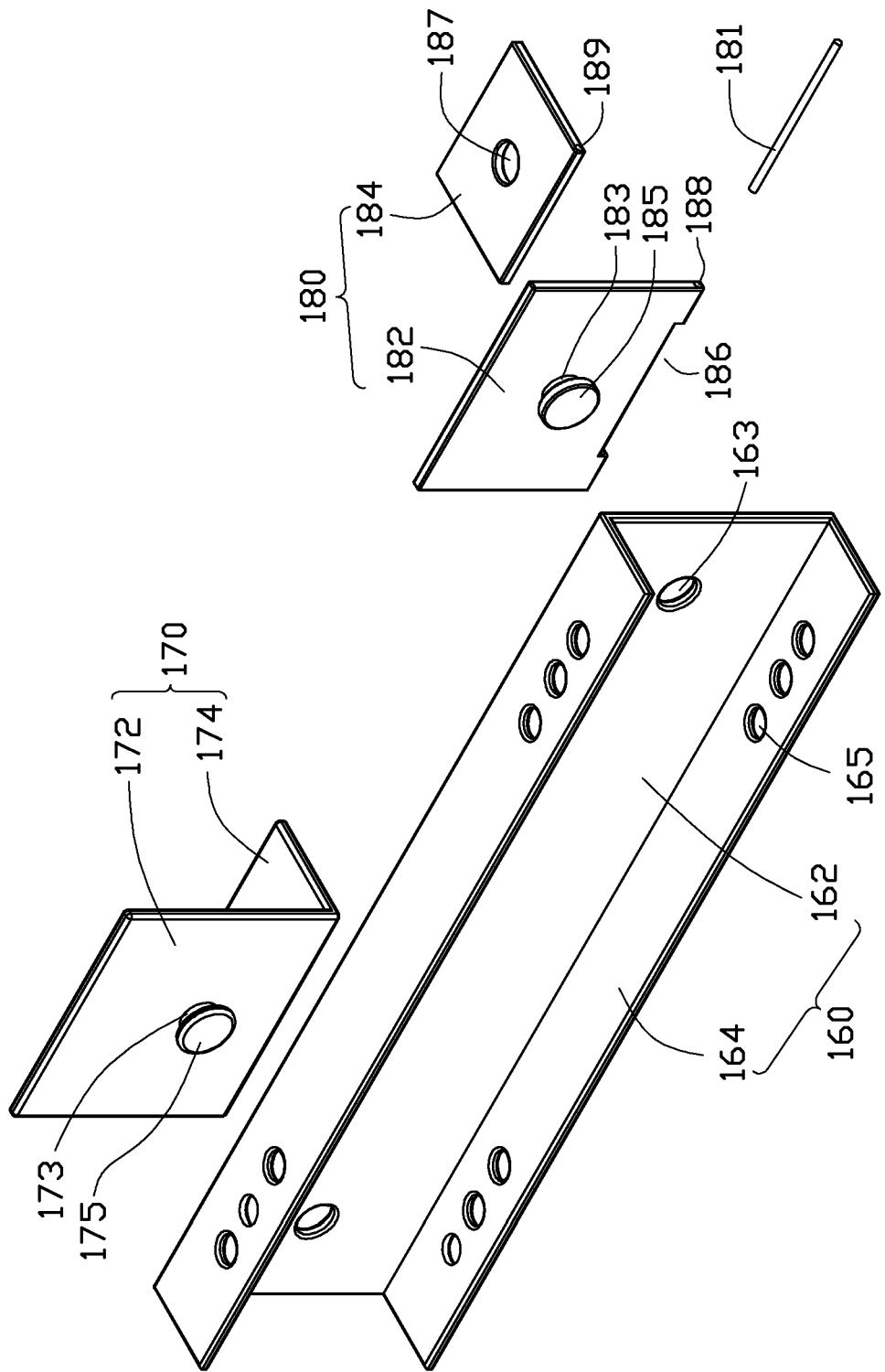
FIG. 3 is an exploded view of a fixing member of the fan module.

Referring to FIG. 3, the fixing portion 160 includes a main body 162 and a pair of flanges 164. The main body 162 of the fixing portion 160 is elongated and rectangular. A height of the main body 162 is approximately the same as that of the frame 120 of the axial fan 12, and a length of the main body 162 is substantially the same as that of the frame 120 of the axial fan 12. A through hole 163 is defined in the main body 162 adjacent to each shorter edge of the main body 162. The flanges 164 extend perpendicularly from top and bottom edges of the main body 162 to abut the top wall 121 and the bottom wall 123 of the axial fan 12, respectively. A fixing hole 165 is defined in the flange 164 adjacent to each end of the flange 164. Screws extend through the fixing holes 165 of the flanges 164 to engage in the mounting holes 129 of the top wall 121 and the mounting holes 127 of the bottom wall 123 of the axial fan 12 to fix the fixing portion 160 of the fixing member 16 on the axial fan 12.

The first rotary portion 170 includes a first connecting plate 172 and a first fixing plate 174. The first fixing plate 174 perpendicularly intersects with a bottom edge of the first connecting plate 172. A first aperture 177 is defined in a middle of the first fixing plate 174. A first pole 173 extends outwards from a middle of the first connecting plate 172 with a diameter not larger than that of the through holes 163 of the fixing portion 160. A free end of the first pole 173 is flatted to form a first head 175 which is larger than the first pole 173 in diameter after the first pole 173 extending through one of the through holes 163 of the fixing portion 160. Thus, the first head 175 abuts the main body 162 of the fixing portion 160 at a periphery of the through hole 163 to hold the first rotary portion 170 on the fixing portion 160.

The second rotary portion 180 includes a second connecting plate 182, a pivot 181, and a second fixing plate 184 rotatably connected to the second connecting plate 182 by the pivot 181. A second pole 183 extends outwards from a middle of the second connecting plate 182 with a diameter not larger than that of the through holes 163 of the fixing portion 160. A free end of the second pole 183 is flattened to form a second head 185 wider than the second pole 183 after the second pole 183 has been extended through the other one of the through holes 163 of the fixing portion 160. Thus the second head 185 abuts against the main body 162 of the fixing portion 160 at a periphery of the other through hole 163 to hold the second rotary portion 180 on the fixing portion 160.

An axial hole 188 extends through the second fixing plate 184 along a longitudinal direction. The axial hole 188 is formed adjacent to a bottom edge of the second fixing plate 184. A diameter of the axial hole 188 is approximately the same as that of the pivot 181. A cutout 186 is defined at a middle of a bottom edge of the second fixing plate 184. The cutout 186 communicates with the axial hole 188. A width of the cutout 186 is approximately the same as that of the second fixing plate 184. A groove 189 extends through the second fixing plate 184. The groove 189 is formed adjacent to a lateral edge of the second fixing plate 184 with a diameter the same as that of the axial hole 188 of the second connecting plate 182. The pivot 181 extends through the groove 189 of the second fixing plate 184 with two ends thereof received in the axial hole 188 of the second connecting plate 182. A second aperture 187 is defined in a middle of the second fixing plate 184.

Figure 4:
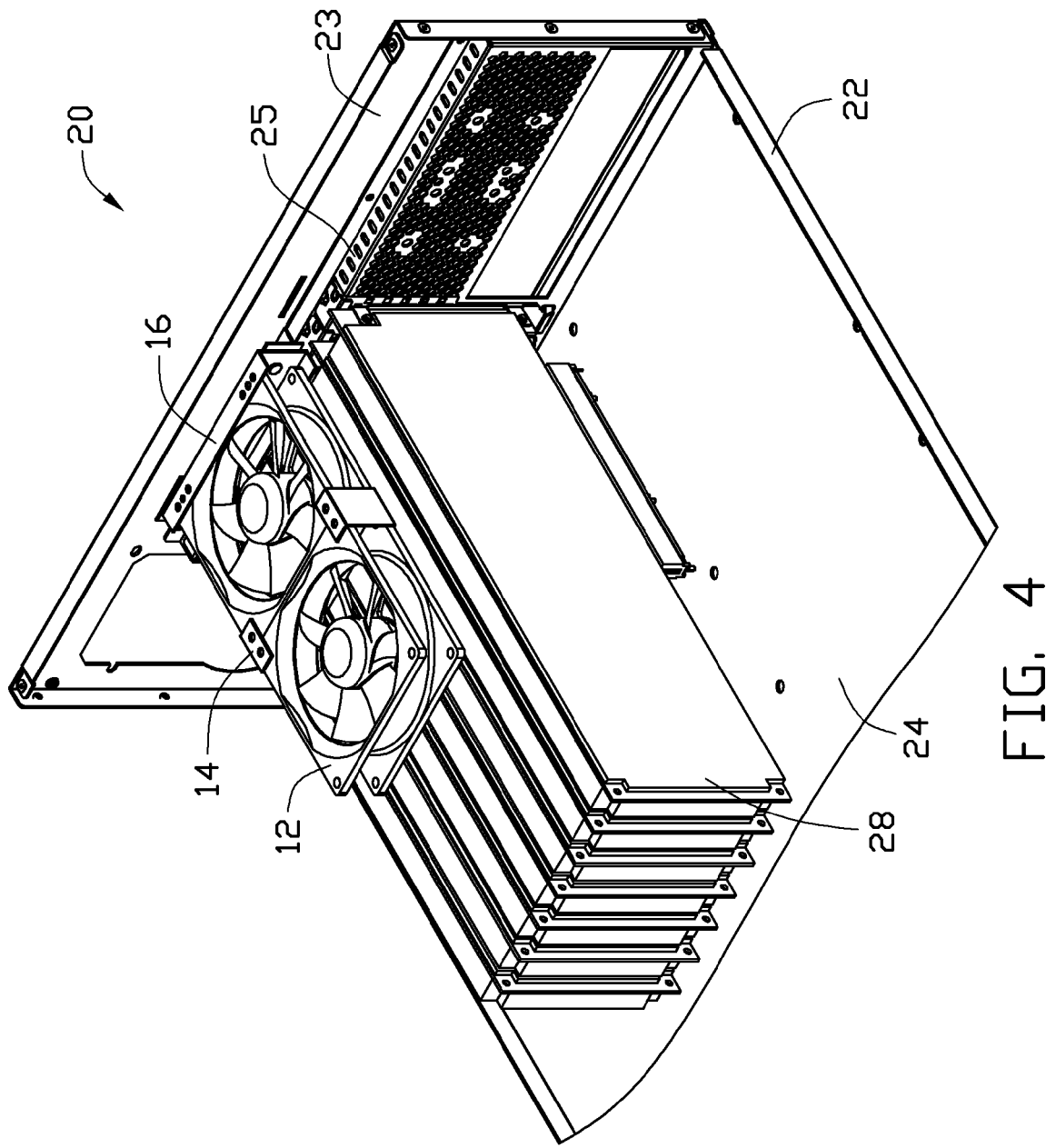
FIG. 4 shows the fan module of FIG. 1 being applied in an electronic device for cooling expansion cards thereof.

FIG. 4 shows the fan module 10 being arranged in an electronic device 20 for dissipating heat. The electronic device 20 includes an enclosure 22, a circuit board 24 received in the enclosure 22, and a plurality of expansion cards 28 arranged on the circuit board 24. The expansion cards 28 are arranged vertically, and are parallel to each other. The fan module 10 is arranged on top sides of the expansion cards 28. The first fixing plate 174 and the second fixing plate 184 of the fixing member 16 are arranged on a step 25 of a lateral wall 23 of the enclosure 22. Screws extend through the first aperture 177 and the second aperture 187 to fix the first fixing plate 174 and the second fixing plate 184 on the step 25, assembling the fan module 10 in the electronic device 20. In such a state, the first and second fixing plates 174, 184 of the first and second rotary portions 170, 180 are horizontal, and thus are perpendicular to an axial direction of the axial fan 12. Thus, airflow of the axial fans 12 can flow downwards to cool the expansion cards 28.

Figure 5:
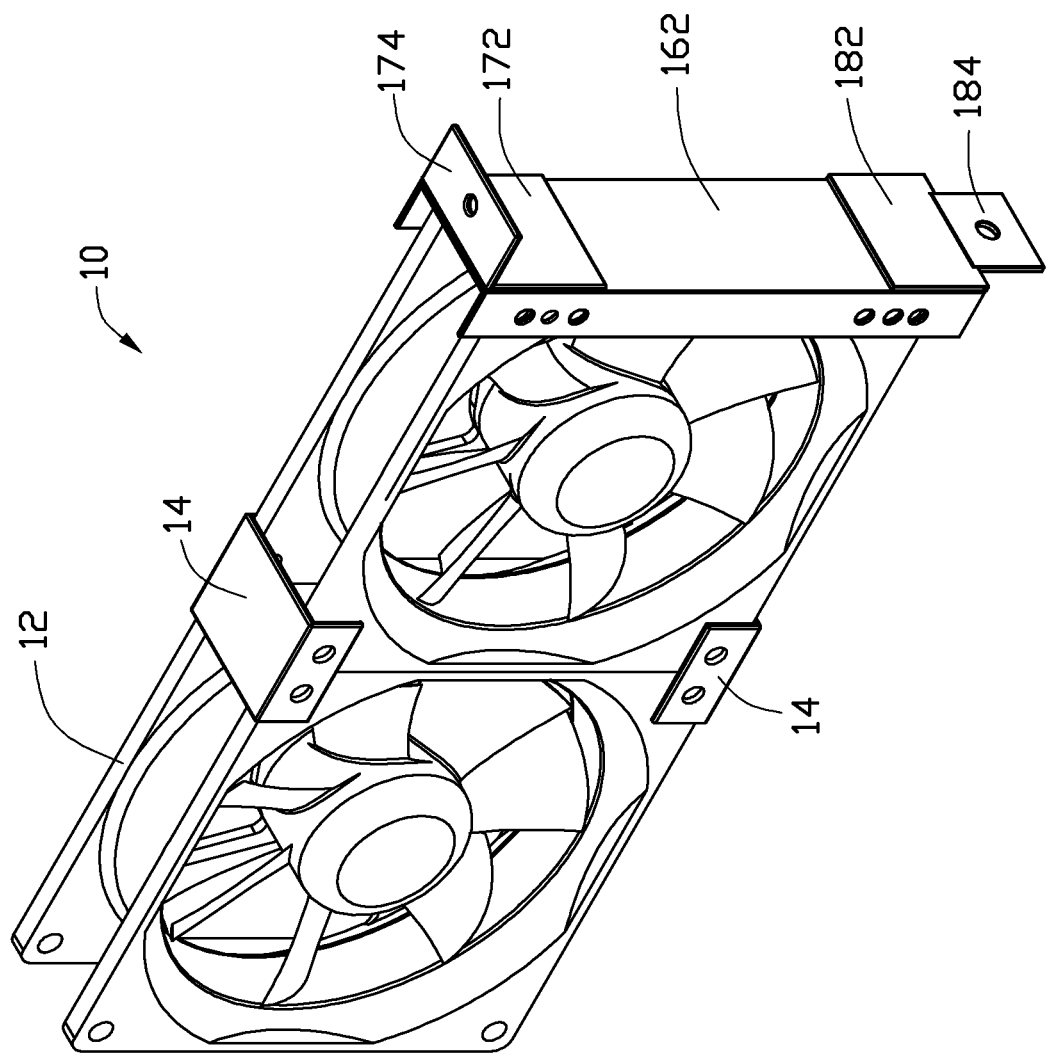
FIG. 5 shows an alternative state of the fan module.
Figure 6:
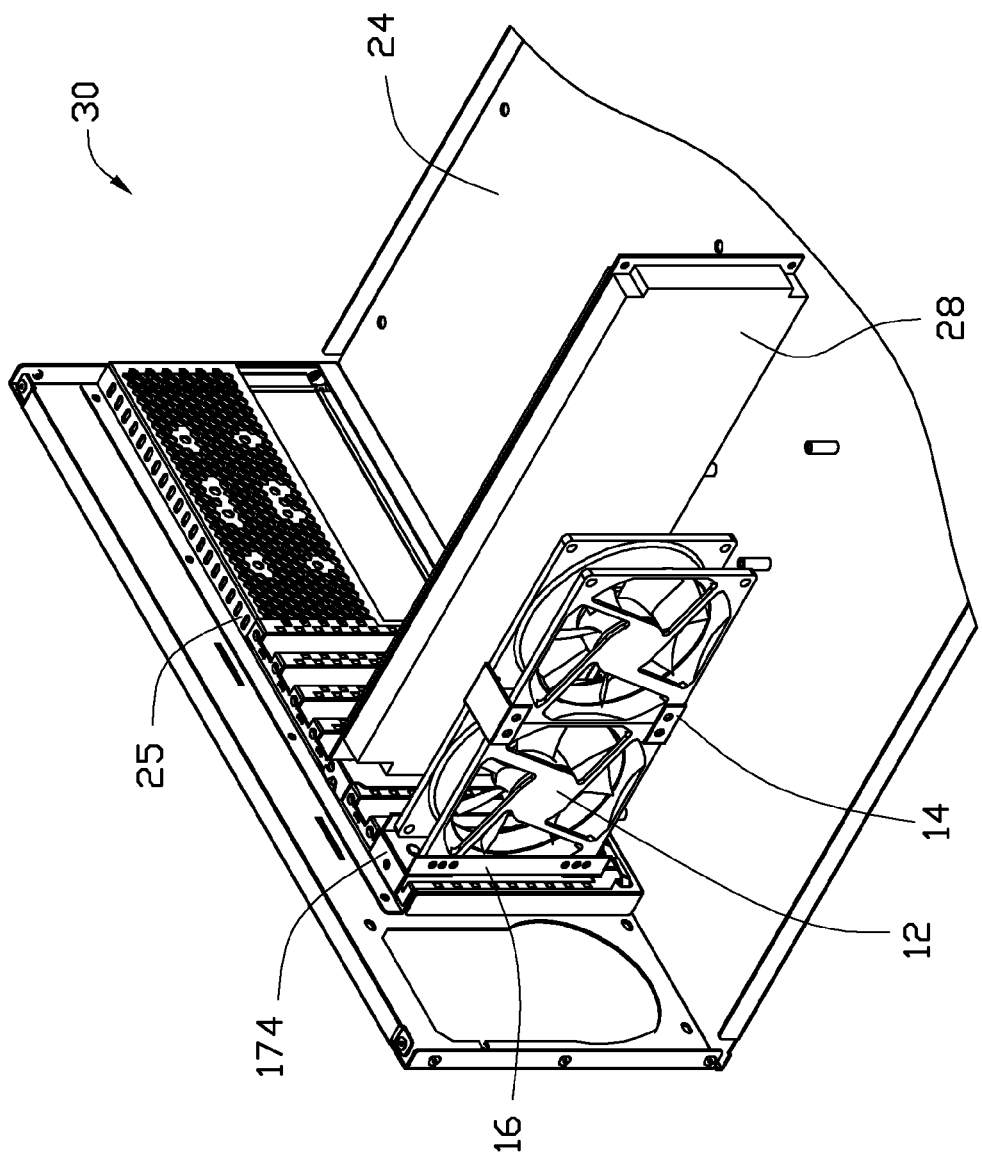
FIG. 6 shows the fan module of FIG. 5 being applied in an electronic device for cooling an expansion card thereof.

Referring to FIGS. 5 and 6, the fan module 10 is applied to an alternative electronic device 30 which has only one expansion card 28. In such a state, the fan module 10 is arranged at a lateral side of the expansion card 28 to generate airflow flowing horizontally towards the expansion card 28. The first rotary portion 170 and the second rotary portion 180 of the fixing member 16 are respectively rotated around the first pole 173 and the second pole 183 about 90 degrees to cause the first fixing plate 174 and the second fixing plate 184 to be away from each other. Thus, the first fixing plate 174 is parallel to axial direction of the axial fan 12. Further, the second fixing plate 184 is rotated around the pivot 181 to be coplanar with the second connecting plate 182. Thus, the first fixing plate 174 can be arranged on the step 25 of the lateral wall 23 of the enclosure 22, while the second fixing plate 184 abuts against the lateral wall 23 of the enclosure 22. Accordingly, screws can extend through the first aperture 177 to fix the first fixing plate 174 on the step 25, and through the second aperture 187 to fix the second fixing plate 184 on the lateral wall 23 to assemble the fan module 10 to the electronic device 20. It should be understood that the first fixing plate 174 of the first rotary portion 170 and the second fixing plate 184 of the second rotary portion 180 of the fixing member 16 can be rotated to various states according to arrangement of the expansion cards 28, thereby maximizing cooling efficiency for each orientation of the expansion card(s) 28.

It is to be understood, however, that even though numerous characteristics and advantages of embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A fan module, comprising:
a cooling fan; and
a fixing member comprising a fixing portion fixed on the cooling fan, a first rotary portion rotatably connected to the fixing portion, and a second rotary portion rotatably connected to the fixing portion;
wherein the first rotary portion comprises a first connecting plate rotatably connected to the fixing portion and a first fixing plate connected to the first connecting plate, the first fixing plate being rotatably connected to the first connecting plate via a pivot, an axial hole extending through the first connecting plate along a longitudinal direction, a cutout being defined at a middle of a lateral edge of the first connecting plate, the cutout communicating with the axial hole, the pivot extending through the first fixing plate with opposite ends received in the axial hole of the first connecting plate.

2. The fan module of claim 1, wherein the second rotary portion comprises a second connecting plate rotatably connected to the fixing portion and a second fixing plate fixedly connected to second connecting plate.

3. The fan module of claim 2, wherein the second fixing plate perpendicularly intersects with the second connecting plate.

4. The fan module of claim 2, wherein a first pole extends from the first connecting plate through the fixing portion, and a free end of the first pole is flatted to engage with the fixing portion to hold the first rotary portion on the fixing portion.

5. The fan module of claim 2, wherein a first aperture is defined in the first fixing plate for fixing the fixing member.

6. The fan module of claim 4, wherein a second pole extends from the second connecting plate through the fixing portion, and a free end of the second pole is flatted to engage with the fixing portion to hold the second rotary portion on the fixing portion.

7. The fan module of claim 5, wherein a second aperture is defined in the second fixing plate for fixing the fixing member.

8. The fan module of claim 1, wherein the fixing portion of the fixing member comprises a main body and a pair of flanges bending from opposite edges of the main body, the flanges being fixed on the cooling fan, the first rotary portion and the second rotary portion being rotatably connected to the main body of the fixing portion.

9. An electronic device, comprising:
an enclosure;
an expansion card received in the enclosure; and
a fan module received in the enclosure for dissipating heat of the expansion card, the fan module comprising a cooling fan and a fixing member, the fixing member comprising a fixing portion fixed on the cooling fan, a first rotary portion rotatably connected to the fixing portion, and a second rotary portion rotatably connected to the fixing portion, the first rotary portion and the second rotary portion being fixed on the enclosure;

wherein the first rotary portion and the second rotary portion each comprise a connecting plate rotatably connected to the fixing portion and a fixing plate connected to the connecting plate, an aperture being defined in the fixing plate for fixing the first rotary portion and the second rotary portion to the enclosure, the fixing plate of the second rotary portion being rotatable connected to the connecting plate of the second rotary portion, an axial hole extending through the connecting plate of the second rotary portion along a longitudinal direction, a cutout being defined at a middle of a lateral edge of the connecting plate of the second rotary portion, the cutout communicating with the axial hole, a pivot extending through the fixing plate of the second rotary portion with opposite ends received in the axial hole of the connecting plate of the second rotary portion.

10. The electronic device of claim 9, wherein the fixing plate of the first rotary portion fixedly and perpendicularly intersects with the connecting plate of the first rotary portion.

11. The electronic device of claim 9, wherein the fixing portion of the fixing member comprises a main body and a pair of flanges bending from opposite edges of the main body, the flanges being fixed on the cooling fan, the first rotary portion and the second rotary portion being rotatably connected to the main body of the fixing portion.

\* \* \* \* \*